United States Patent
Stolpman (10) Patent No.: US 7,757,150 B2
(45) Date of Patent: Jul. 13, 2010

(54) STRUCTURED PUNCTURING OF IRREGULAR LOW-DENSITY PARITY-CHECK (LDPC) CODES

(75) Inventor: Victor Stolpman, Dallas, TX (US)

(73) Assignee: Nokia Corporation, Espoo (FI)

( * ) Notice: Subject to any disclaimer, the term of this patent is extended or adjusted under 35 U.S.C. 154(b) by 594 days.

(21) Appl. No.: 11/573,620

(22) PCT Filed: Aug. 12, 2005

(86) PCT No.: PCT/IB2005/002420

§ 371 (c)(1),
(2), (4) Date: May 22, 2007

(87) PCT Pub. No.: WO2006/016261

PCT Pub. Date: Feb. 16, 2006

(65) Prior Publication Data

US 2008/0016433 A1    Jan. 17, 2008

(51) Int. Cl.
*H03M 13/00* (2006.01)

(52) U.S. Cl. ............... 714/752; 714/799; 375/240.24; 708/531

(58) Field of Classification Search ............ 714/752, 714/799; 375/240.24; 708/531
See application file for complete search history.

(56) References Cited

U.S. PATENT DOCUMENTS

| | | | |
|---|---|---|---|
| 6,909,393 B2 * | 6/2005 | Atriss et al. ............... 341/163 |
| 6,961,891 B2 * | 11/2005 | Murillo ..................... 714/763 |
| 7,093,179 B2 * | 8/2006 | Shea ......................... 714/755 |
| 7,133,853 B2 * | 11/2006 | Richardson et al. ........... 706/15 |
| 7,139,964 B2 * | 11/2006 | Shen et al. .................. 714/758 |
| 7,181,677 B1 * | 2/2007 | Weng ........................ 714/784 |
| 7,237,171 B2 * | 6/2007 | Richardson ................ 714/752 |
| 7,376,883 B2 * | 5/2008 | Eroz et al. .................. 714/758 |
| 2003/0126551 A1 | 7/2003 | Mantha et al. |
| 2004/0153934 A1 | 8/2004 | Jin et al. |
| 2004/0268205 A1 | 12/2004 | Stolpman |
| 2005/0246616 A1 | 11/2005 | Choi et al. |

FOREIGN PATENT DOCUMENTS

WO    WO 2004/114526 A2    12/2004

OTHER PUBLICATIONS

Jeongseok Ha, Steven W. McLaughlin; *Optimal Puncturing of Irregular Low-Density Parity-Check Codes*; 2003 IEEE International Conference on Communications; May 2003; pp. 3110-3114; vol. 5; ISBN 0-7803-7802-4.

(Continued)

*Primary Examiner*—Esaw T Abraham
(74) *Attorney, Agent, or Firm*—Alston & Bird LLP (57) ABSTRACT

A method of constructing a puncture sequence includes providing a seed puncture sequence including a plurality of elements. The elements of the seed puncture sequence are based upon non-zero elements of a plurality of columns of a parity-check matrix having a column dimension and a row dimension. In this regard, the parity-check matrix defines an error correction code, and has been constructed based upon a seed parity-check matrix derived from an edge ensemble. After providing the seed puncture sequence, a variable node-puncture sequence can be constructed based thereupon. The variable node-puncture sequence, then, corresponds to a puncture sequence configured for processing an error correction code.

32 Claims, 5 Drawing Sheets

OTHER PUBLICATIONS

Hossein Pishro-Nik, Faramarz Fekri; *Results on Punctured LDPC codes*; Information Theory Workshop; Oct. 2004; pp. 215-219; IEEE.

Victor Stolpman, Jianzhong (Charlie) Zhang, Nico Van Waes; *Irregular Structured LDPC Codes*; IEEE 802.16 Broadband Wireless Access Working Group; Aug. 2004; 23 pages; IEEEC802.16e-04/264.

Supplementary European Search Report for EP 05 79 9947 dated Aug. 6, 2009.

Dholakia, A., et al., *Rate-Compatible Low-Density Parity-Check Codes for Digital Subscriber Lines*, Proc., IEEE International Conference on Communications, ICC 2004, vol. 1, Jun. 2004, pp. 415-419.

Dholakia, A. et al., *Rate-Compatible Array LDPC Codes*, Proc., IEEE International Symposium on Information Theory, ISIT 2004, Jun./Jul. 2004, p. 154.

Ha, J. et al., *Optimal Puncturing Distributions for Rate-Compatible Low-Density Parity-Check Codes*, Proc., IEEE International Symposium on Information Theory, ISIT 2003, Jun.-Jul. 2003, p. 233.

Hocevar, D. E., *LDPC Code Construction With Flexible Hardware Implementation*, Proc., IEEE International Conference on Communications, ICC 2003, vol. 4, May 2003, pp. 2708-2712.

Ha, J. et al., *Optimal Puncturing of Irregular Low-Density Parity-Check Codes*, Proc., IEEE International Conference on Communications, ICC 2003, May 2003, pp. 3110-3114.

Zhong, H. et al., *Joint Code-Encoder-Decoder Design for LDPC Coding System VLSI Implementation*, Proc., IEEE International Symposium on Circuits and Systems, vol. 2, May 2004, pp. 389-392.

Thorpe, Jr. et al., *Methodologies for Designing LDPC Codes Using Protographs and Circulants*, Proc, IEEE International Symposium on Information Theory, ISIT 2004, Jun.-Jul. 2004, p. 236.

Abbasfar, A. et al., *Accumulate Repeat Accumulate Codes*, Proc., IEEE International Symposium on Information Theory, ISIT 2004, Jun.-Jul. 2004, p. 505.

Stolpman, V. et al., *Irregular Structure LDPC Codes*, IEEE C802.16e-04/264, Aug. 2004, 23 pages.

Ha, J. et al., *Optimal Puncturing of Irregular Low-Density Parity-Check Codes*, IEEE, 2003, pp. 3110-3114.

\* cited by examiner

STRUCTURED PUNCTURING OF IRREGULAR LOW-DENSITY PARITY-CHECK (LDPC) CODES

FIELD OF THE INVENTION

The present invention generally relates to parity-check codes for encoding and decoding transmissions, and more particularly relates to block coding techniques such as low-density parity-check (LDPC) coding techniques.

BACKGROUND OF THE INVENTION

Low-density parity-check (LDPC) codes have recently been the subject of increased research interest for their enhanced performance on additive white Gaussian noise (AWGN) channels. As described by Shannon's Channel Coding Theorem, the best performance is achieved when using a code consisting off very long codewords. In practice, codeword size is limited in the interest of reducing complexity, buffering, and delays. LDPC codes are block codes, as opposed to trellis codes that are built on convolutional codes. LDPC codes constitute a large family of codes including turbo codes. Block codewords are generated by multiplying (modulo 2) binary information words with a binary matrix generator. LDPC codes use a check parity matrix H, which is used for decoding. The term low density derives from the characteristic that the check parity matrix has a very low density of non-zero values, making it a relatively low complexity decoder while retaining good error protection properties.

Figure 1A:
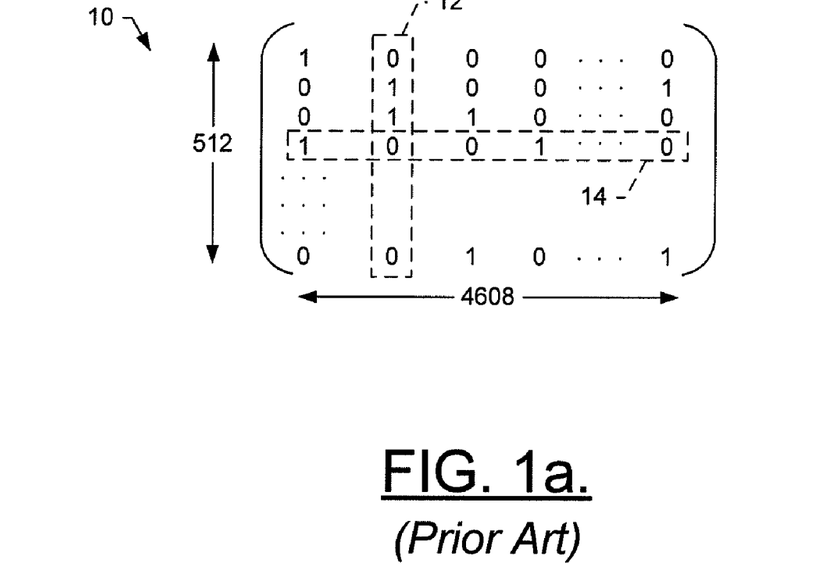
FIG. 1a is a matrix of an exemplary low-density parity-check mother code, according to the prior art.
Figure 1B:
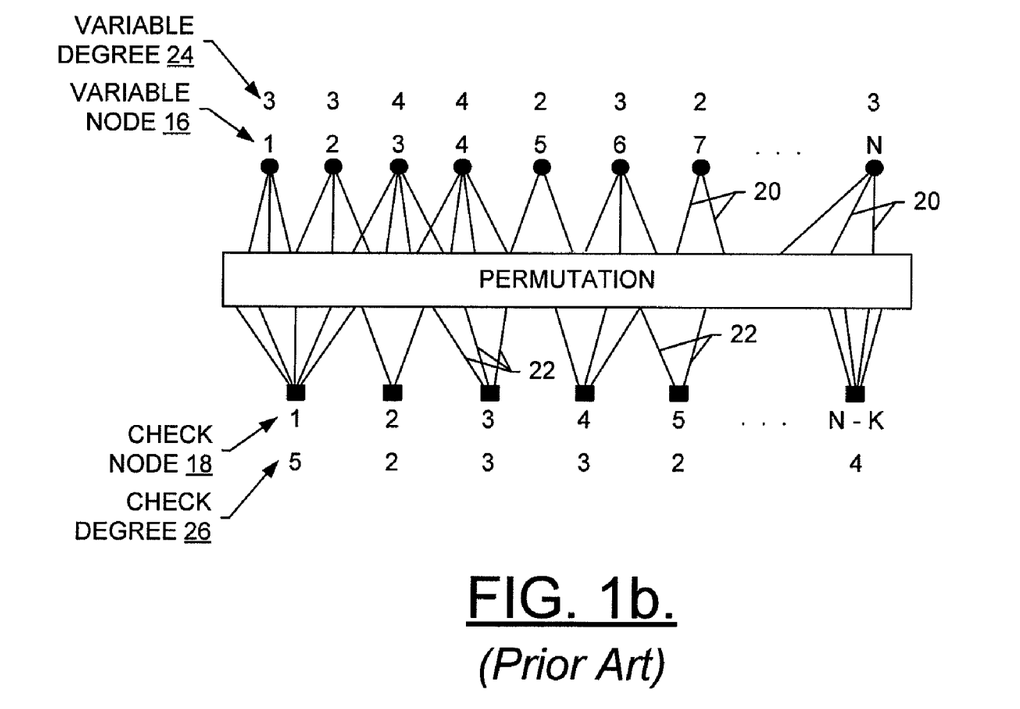
FIG. 1b is a bipartite graph depicting connections between variable and check nodes, according to the prior art.

The parity check matrix H measures (N−K)×N, wherein N represents the number of elements in a codeword and K represents the number of information elements in the codeword. The matrix H is also termed the LDPC mother code. For the specific example of a binary alphabet, N is the number of bits in the codeword and K is the number of information bits contained in the codeword for transmission over a wireless or a wired communication network or system. The number of information elements is therefore less than the number of codeword elements, so K<N. FIGS. 1$a$ and 1$b$ graphically describe an LDPC code. The parity check matrix 10 of FIG. 1$a$ is an example of a commonly used 512×4608 matrix, wherein each matrix column 12 corresponds to a codeword element (variable node of FIG. 1$b$) and each matrix row 14 corresponds to a parity check equation (check node of FIG. 1$b$). If each column of the matrix H includes exactly the same number m of non-zero elements, and each row of the matrix H includes exactly the same number k of non-zero elements, the matrix represents what is termed a regular LDPC code. If the code allows for non-uniform counts of non-zero elements among the columns and/or rows, it is termed an irregular LDPC code.

Irregular LDPC codes have been shown to significantly outperform regular LDPC codes, which has generated renewed interest in this coding system since its inception decades ago. The bipartite graph of FIG. 1$b$ illustrates that each codeword element (variable nodes 16) is connected only to parity check equations (check nodes 18) and not directly to other codeword elements (and vice versa). Each connection, termed a variable edge 20 or a check edge 22 (each edge represented by a line in FIG. 1$b$), connects a variable node to a check node and represents a non-zero element in the parity check matrix H. The number of variable edges connected to a particular variable node 16 is termed its degree, and the number of variable degrees 24 are shown corresponding to the number of variable edges emanating from each variable node. Similarly, the number of check edges connected to a particular check node is termed its degree, and the number of check degrees 26 are shown corresponding to the number of check edges 22 emanating from each check node. Since the degree (variable, check) represents non-zero elements of the matrix H, the bipartite graph of FIG. 1$b$ represents an irregular LDPC code matrix. The following discussion is directed toward irregular LDPC codes since they are more complex and potentially more useful, but may also be applied to regular LDPC codes with normal skill in the art.

Irregular codes can be designed for many different symmetric channels via density evolution and genetic hill-climbing algorithms (i.e., Differential Evolution) by adjusting variable edge polynomial λ(x) and check edge polynomial ρ(x), defined as:

$$\lambda(x) = \sum_{i=2}^{d_l} \lambda_i x^{i-1} \text{ and } \rho(x) = \sum_{i=2}^{d_r} \rho_i x^{i-1}$$

where $\{\lambda_2, \lambda_3, \ldots \lambda_{d_l}\}$ and $\{\rho_2, \rho_3, \ldots \rho_{d_r}\}$ represent the edge distributions indicating the fraction of edges 20, 22 connected to variable and check nodes of degrees $\{2, 3, \ldots d_l\}$ and $\{2, 3, \ldots d_r\}$, respectively, out of the total number of edges. The edge distributions determine the asymptotic performance of the code ensemble, the code rate of the ensemble, and any code realizations derived from the distributions.

In accordance with various conventional systems implementing an LDPC coding architecture including multiple coding rates for its error control, an LDPC encoder encodes a K-dimensional sequence of information bits into an N-dimensional codeword by accessing a stored LDPC mother-code and one of several stored puncture sequences, one puncture sequence corresponding to one code rate. As will be appreciated, however, such conventional systems may require significant non-volatile memory for each coding rate for a single mother code. In this regard, in one conventional system, a different LDPC code is designated for each coding rate and channel (i.e., different code realizations from different λ(x) and ρ(x) corresponding to the desired code rates). Such a conventional system uses one LDPC code for each coding rate, and may increase substantially when the set of code rates is large and/or when code words are long. The memory requirements can render this approach prohibitive for adaptive coding and modulation schemes operating in slowly varying channels. In another conventional system, codeword elements of a single LDPC code are punctured using multiple puncturing sequences chosen at random using puncturing probabilities. This system requires memory for storing multiple puncturing sequences, one for each code rate, which may become prohibitive for a large set of coding rates and/or long codeword lengths.

Besides the substantial amount of memory that may be required to store conventional puncturing sequences for various coding rates, the determination of the puncturing sequences may itself be computationally intensive. In this regard, one conventional technique for designing a puncture sequence is based on linear programming to determine puncturing probabilities that maximize the puncturing fraction:

$$p^{(0)} = \sum_{j=2}^{d_L} \lambda'_j \pi_j^{(0)}$$

for a given signal to noise ratio (SNR, or bit/symbol energy to noise power spectral density $E_b/N_0$) threshold, where $\lambda'_j$ represents the fraction of variable nodes 16 of degree j. In another conventional technique, a puncture sequence is designed based on differential evaluation based on Density Evolution, which may be somewhat more complex than the linear programming technique with near identical results. Each of these techniques for designing the puncture sequences are very computationally expensive, and their resulting sequences themselves require so much memory as to be potentially prohibitive for an adaptive coding system.

SUMMARY OF THE INVENTION

In an effort to at least partially overcome the drawbacks of conventional systems and methods of LDPC coding, a coding system and method has been developed that is more compatible with adaptive coding communication systems, especially by requiring less memory than that required in conventional systems. Such a system and method is disclosed in U.S. patent application Ser. No. 10/608,943, entitled: Low-Density Parity-Check Codes for Multiple Code Rates, filed Jun. 26, 2003 and published Dec. 30, 2004 as U.S. Patent Application Publication No. 2004/0268205, the contents of which are hereby incorporated by reference. In accordance with the system and method of the '943 application, puncture sequences for a number of effective code rates can be determined in a nested manner, the puncture probabilities being adjusted using the integer index of each sequence in a code of finite length. By nesting the puncture sequences, the system and method of the '943 application is better adapted for use in adaptive coding rate communications systems, and significantly reduces the memory requirements for multiple code rates.

Whereas systems and methods such as those described above adequately perform LDPC coding, it is generally desirable to improve upon existing systems and methods, including those of the '943 application. Accordingly, exemplary embodiments of the present invention provide an improved network entity, method and computer program product for constructing a variable node-puncture sequence, and using that sequence to process an error correction code. Exemplary embodiments of the present invention address the memory issues associated with puncturing low-density parity-check (LDPC) codes. In this regard, puncturing LDPC codes can include appropriately selecting a variable-degree, and thus a variable-node, to puncture. In randomly constructed LDPC codes, such selection is conventionally accomplished for each code of a particular block length, which typically results in large storage requirements when the system uses a large number of blocks and code rates. For structured LDPC codes based on permutation sub-matrices, multiple block sizes can be made from a "seed" matrix, but conventional techniques did not provide a way to efficiently puncturing these codes in a structured manner.

Exemplary embodiments of the present invention therefore provide a structured puncturing approach to LDPC codes, such as irregular LDPC codes. Exemplary embodiments offer a significant reduction in storage requirements and can maintain relatively good performance across a wide range of code rates and permutation sub-matrix sizes. Generally, and as explained further below, the approach of exemplary embodiments of the present invention uses a "seed" puncture sequence comprising of either variable-degrees or variable-nodes designed for a "seed" parity-check matrix to achieve a wide range of code rates. These seed puncture sequences can then be expanded in a structured way so as to deliver the appropriate puncturing pattern for a parity-check matrix expanded from the seed parity-check matrix, thereby maintaining the same asymptotic properties belonging to the edge distributions and puncturing probabilities of the seed components.

According to one aspect of the present invention, a method of constructing a puncture sequence includes providing a seed puncture sequence including a plurality of elements. The elements of the seed puncture sequence are based upon non-zero elements of a plurality of columns of a parity-check matrix having a column dimension and a row dimension. In this regard, the parity-check matrix defines an error correction code, and has itself been constructed based upon a seed parity-check matrix derived from an edge ensemble. The seed parity-check matrix may be of dimension $(m(N_{SEED}-K_{SEED}) \times mN_{SEED})$, where $N_{SEED}$ and $K_{SEED}$ represent the length and the number of information bits, respectively, of the error correction code defined by the seed parity-check matrix. After providing the seed puncture sequence, a variable node-puncture sequence can be constructed based thereupon. The variable node-puncture sequence, then, corresponds to a puncture sequence configured for processing an error correction codeword.

More particularly, the seed puncture sequence can comprise a seed puncture-degree sequence including a plurality of elements each of which indicate a number of non-zero elements of a column of the parity-check matrix. For example, at least one seed puncture-degree sequence $d_{SEED,m}$ of dimension $(L_m \times 1)$ can be provided for m=1, 2, ... M. In such instances, the seed puncture-degree sequence $d_{SEED,m}$ can include a plurality of elements each of which indicate a number of non-zero elements of the column of parity-check matrix $H_m$ of dimension $(m(N_{SEED}-K_{SEED}) \times mN_{SEED})$. Also in such instances, the variable node-puncture sequence can be constructed by first constructing an expanded puncture-degree sequence $p_{DEGREE}$ of dimension $((L_m N/mN_{SEED}) \times 1)$ based upon the at least one seed puncture-degree sequence $d_{SEED,m}$. In this regard, the expanded puncture-degree sequence can include a plurality of elements that each indicate a number of non-zero elements of the column of an expanded parity-check matrix H of dimension $((N-K) \times N)$, where $N/mN_{SEED}$ comprises a positive integer. Then, the expanded puncture-degree sequence can be mapped to a variable node-puncture sequence, where the variable node-puncture sequence includes a plurality of elements each of which indicate a location of a column of the expanded parity-check matrix H.

In the alternative of the seed puncture sequence comprising a seed puncture-degree sequence, the seed puncture sequence can comprise a seed puncture-node sequence including a plurality of elements each of which indicate a location of a column of the parity-check matrix. Similar to the seed puncture-degree sequence, for example, at least one seed puncture-node sequence $n_{SEED,m}$ of dimension $(L_m \times 1)$ can be provided for m=1, 2, ... M. In such instances, the seed puncture-node sequence $n_{SEED,m}$ can include a plurality of elements that each indicate a location of a column of parity-check matrix $H_m$ of dimension $(m(N_{SEED}-K_{SEED}) \times mN_{SEED})$. A variable node-puncture sequence $v_{NODE}^T = [v_1^T v_2^T \ldots v_{L_m}^T]$, then, can be constructed based upon at least one seed puncture-node sequence $$n_{SEED,m} = \begin{bmatrix} n_1^{(m)} & n_2^{(m)} & \cdots & n_{L_m}^{(m)} \end{bmatrix}^T.$$

In such instances, the variable node-puncture sequence $v_{NODE}^T$ can include a plurality of elements:

$$v_i^T = \begin{bmatrix} 1 & 2 & \cdots & \frac{N}{mN_{SEED}} \end{bmatrix} + (n_i^{(m)} - 1)\frac{N}{mN_{SEED}}$$

for i=1, 2, ..., $L_m$, where superscript T notationally represents a matrix transpose, and N represents a length of an expanded parity-check matrix H.

Irrespective of how the puncture sequence is constructed, the puncture sequence can thereafter be used to process an error correction code. In such instances, the error correction can be generated according to a sub-process including providing a seed parity-check matrix having a column dimension and a row dimension. A structured array exponent matrix can then be constructed using modulo arithmetic of a number equal to or greater than the seed parity-check matrix column dimension. Next, a final exponential matrix can be constructed based upon the seed parity-check matrix and the structured array exponent matrix. Thereafter, the final exponential matrix can be expanded to form an expanded parity-check matrix corresponding to the error correction code.

According to other aspects of the present invention a network entity and computer program product are provided for constructing a variable node-puncture sequence, and using that sequence to process an error correction code. Exemplary embodiments of the present invention therefore provide an improved network entity, method and computer program product. And as indicated above and explained in greater detail below, the network entity, method and computer program product of exemplary embodiments of the present invention may solve the problems identified by prior techniques and may provide additional advantages.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
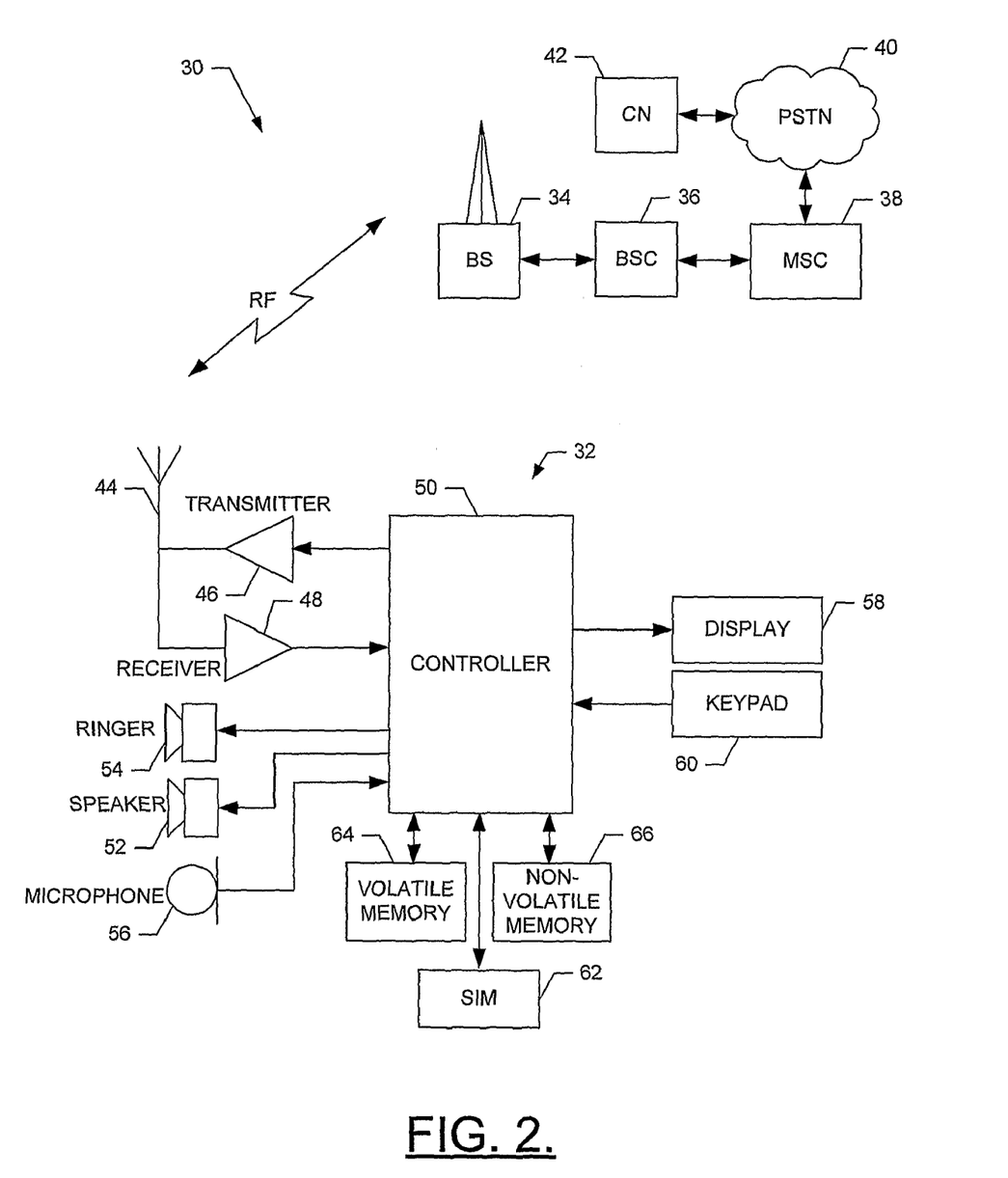
FIG. 2 illustrates a schematic block diagram of a wireless communication system including a plurality of network entities, according to exemplary embodiments of the present invention.

Referring to FIG. 2, an illustration of one type of wireless communications system 30 including a plurality of network entities, one of which comprises a terminal 32 that would benefit from the present invention is provided. As explained below, the terminal may comprise a mobile telephone. It should be understood, however, that such a mobile telephone is merely illustrative of one type of terminal that would benefit from the present invention and, therefore, should not be taken to limit the scope of the present invention. While several exemplary embodiments of the terminal are illustrated and will be hereinafter described for purposes of example, other types of terminals, such as portable digital assistants (PDAs), pagers, laptop computers and other types of voice and text communications systems, can readily employ the present invention. In addition, the system and method of the present invention will be primarily described in conjunction with mobile communications applications. It should be understood, however, that the system and method of the present invention can be utilized in conjunction with a variety of other applications, both in the mobile communications industries and outside of the mobile communications industries.

The communication system 30 provides for radio communication between two communication stations, such as a base station (BS) 34 and the terminal 32, by way of radio links formed therebetween. The terminal is configured to receive and transmit signals to communicate with a plurality of base stations, including the illustrated base station. The communication system can be configured to operate in accordance with one or more of a number of different types of spread-spectrum communication, or more particularly, in accordance with one or more of a number of different types of spread spectrum communication protocols. More particularly, the communication system can be configured to operate in accordance with any of a number of 1G, 2G, 2.5G and/or 3G communication protocols or the like. For example, the communication system may be configured to operate in accordance with 2G wireless communication protocols IS-95 (CDMA) and/or cdma2000. Also, for example, the communication system may be configured to operate in accordance with 3G wireless communication protocols such as Universal Mobile Telephone System (UMTS) employing Wideband Code Division Multiple Access (WCDMA) radio access technology. Further, for example, the communication system may be configured to operate in accordance with enhanced 3G wireless communication protocols such as 1X-EVDO (TIA/EIA/IS-856) and/or 1X-EVDV. It should be understood that operation of the exemplary embodiment of the present invention is similarly also possible in other types of radio, and other, communication systems. Therefore, while the following description may describe operation of an exemplary embodiment of the present invention with respect to the aforementioned wireless communication protocols, operation of an exemplary embodiment of the present invention can analogously be described with respect to any of various other types of wireless communication protocols, without departing from the spirit and scope of the present invention.

The base station 34 is coupled to a base station controller (BSC) 36. And the base station controller is, in turn, coupled to a mobile switching center (MSC) 38. The MSC is coupled to a network backbone, here a PSTN (public switched telephonic network) 40. In turn, a correspondent node (CN) 42 is coupled to the PSTN. A communication path is formable between the correspondent node and the terminal 32 by way of the PSTN, the MSC, the BSC and base station, and a radio link formed between the base station and the terminal. Thereby, the communications, of both voice data and non-voice data, are effectual between the CN and the terminal. In the illustrated, exemplary implementation, the base station defines a cell, and numerous cell sites are positioned at spaced-apart locations throughout a geographical area to define a plurality of cells within any of which the terminal is capable of radio communication with an associated base station in communication therewith.

The terminal 32 includes various means for performing one or more functions in accordance with exemplary embodiments of the present invention, including those more particularly shown and described herein. It should be understood, however, that the terminal may include alternative means for performing one or more like functions, without departing from the spirit and scope of the present invention. More particularly, for example, as shown in FIG. 2, in addition to one or more antennas 44, the terminal of one exemplary embodiment of the present invention can include a transmitter 26, receiver 48, and controller 50 or other processor that provides signals to and receives signals from the transmitter and receiver, respectively. These signals include signaling information in accordance with the communication protocol(s) of the wireless communication system, and also user speech and/or user generated data. In this regard, the terminal can be capable of communicating in accordance with one or more of a number of different wireless communication protocols, such as those indicated above. Although not shown, the terminal can also be capable of communicating in accordance with one or more wireline and/or wireless networking techniques. More particularly, for example, the terminal can be capable of communicating in accordance with local area network (LAN), metropolitan area network (MAN), and/or a wide area network (WAN) (e.g., Internet) wireline networking techniques. Additionally or alternatively, for example, the terminal can be capable of communicating in accordance with wireless networking techniques including wireless LAN (WLAN) techniques such as IEEE 802.11 (e.g., 802.11a, 802.11b, 802.11g, 802.11n, etc.), WiMAX techniques such as IEEE 802.16, and/or ultra wideband (UWB) techniques such as IEEE 802.15 or the like.

It is understood that the controller 50 includes the circuitry required for implementing the audio and logic functions of the terminal 32. For example, the controller may be comprised of a digital signal processor device, a microprocessor device, and/or various analog-to-digital converters, digital-to-analog converters, and other support circuits. The control and signal processing functions of the terminal are allocated between these devices according to their respective capabilities. The controller can additionally include an internal voice coder (VC), and may include an internal data modem (DM). Further, the controller may include the functionally to operate one or more client applications, which may be stored in memory (described below).

The terminal 32 can also include a user interface including a conventional earphone or speaker 52, a ringer 54, a microphone 56, a display 58, and a user input interface, all of which are coupled to the controller 38. The user input interface, which allows the terminal to receive data, can comprise any of a number of devices allowing the terminal to receive data, such as a keypad 60, a touch display (not shown) or other input device. In exemplary embodiments including a keypad, the keypad includes the conventional numeric (0-9) and related keys (#, *), and other keys used for operating the terminal. Although not shown, the terminal can include one or more means for sharing and/or obtaining data (not shown).

In addition, the terminal 32 can include memory, such as a subscriber identity module (SIM) 62, a removable user identity module (R-UIM) or the like, which typically stores information elements related to a mobile subscriber. In addition to the SIM, the terminal can include other removable and/or fixed memory. In this regard, the terminal can include volatile memory 64, such as volatile Random Access Memory (RAM) including a cache area for the temporary storage of data. The terminal can also include other non-volatile memory 66, which can be embedded and/or may be removable. The non-volatile memory can additionally or alternatively comprise an EEPROM, flash memory or the like. The memories can store any of a number of client applications, instructions, pieces of information, and data, used by the terminal to implement the functions of the terminal.

As described herein, the client application(s) may each comprise software operated by the respective entities. It should be understood, however, that any one or more of the client applications described herein can alternatively comprise firmware or hardware, without departing from the spirit and scope of the present invention. Generally, then, the network entities (e.g., terminal 32, BS 34, BSC 36, etc.) of exemplary embodiments of the present invention can include one or more logic elements for performing various functions of one or more client application(s). As will be appreciated, the logic elements can be embodied in any of a number of different manners. In this regard, the logic elements performing the functions of one or more client applications can be embodied in an integrated circuit assembly including one or more integrated circuits integral or otherwise in communication with a respective network entity or more particularly, for example, a processor or controller of the respective network entity. The design of integrated circuits is by and large a highly automated process. In this regard, complex and powerful software tools are available for converting a logic level design into a semiconductor circuit design ready to be etched and formed on a semiconductor substrate. These software tools, such as those provided by Avant! Corporation of Fremont, Calif. and Cadence Design, of San Jose, Calif., automatically route conductors and locate components on a semiconductor chip using well established rules of design as well as huge libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

Figure 3:
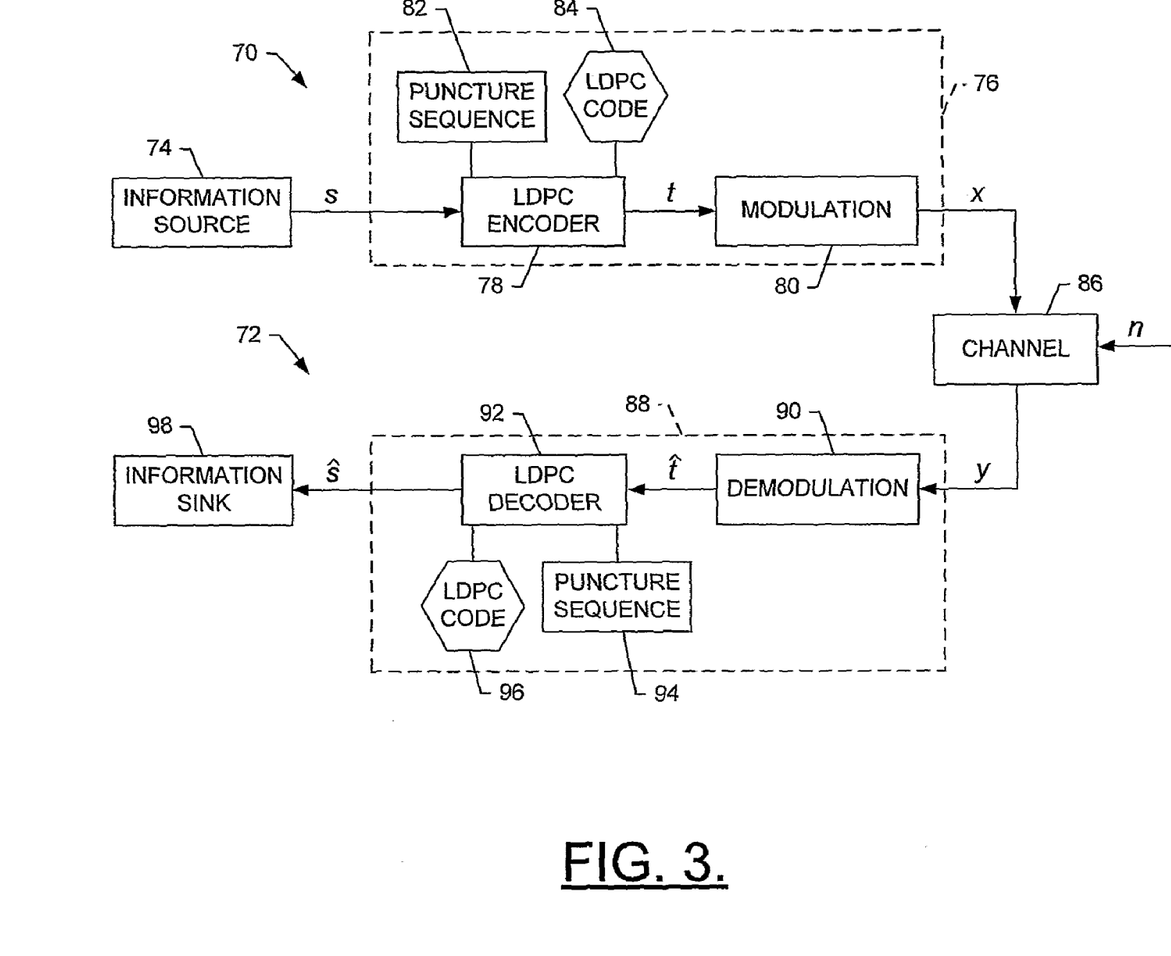
FIG. 3 is a logical block diagram of a communication system according to exemplary embodiments of the present invention.

Reference is now made to FIG. 3, which illustrates a functional block diagram of the system 30 of FIG. 2 in accordance with one exemplary embodiment of the present invention. As shown, the system includes a transmitting entity 70 (e.g., BS 34) and a receiving entity 72 (e.g., terminal 32). As shown and described below, the system and method of exemplary embodiments of the present invention operate to puncture structured irregular low-density parity-check (LDPC) codes. It should be understood, however, that the system and method of exemplary embodiments of the present invention may be equally applicable to puncturing unstructured or otherwise randomly constructed LDPC codes, without departing from the spirit and scope of the present invention. It should further be understood that the transmitting and receiving entities may be implemented into any of a number of different types of transmission systems that transmit coded or uncoded digital transmissions over a radio interface.

In the illustrated system, an information source 74 of the transmitting entity 70 can output a K-dimensional sequence of information bits s into a transmitter 76 that includes an LDPC encoder 78, modulation block 80 and memory 82, 84. The LDPC encoder is capable of encoding the sequence s into an N-dimensional codeword t by accessing a puncture sequence in memory 82, and a LDPC code in memory 84. As explained below, the LDPC encoder enables the transmitting entity to transmit K bits of sequence s per codeword using different code rates by puncturing the codewords encoded from an LDPC code. In this regard, the encoder is capable of puncturing the codewords by selecting and puncturing P codeword bits by removing these bits from the codeword elements that are to be transmitted over one or more channels 86. Before the codeword elements are transmitted over the channel(s), however, the codeword t including the respective elements can be broken up into sub-vectors and provided to the modulation block, which can modulate and up-convert the sub-vectors to a vector x of the sub-vectors. The vector x can then be transmitted over the channel(s).

As the vector x is transmitted over the channel(s) 86 (or by virtue of system hardware), additive white Gaussian noise (AWGN) n can be added thereto so that the vector y=x+n is received by the receiving entity 72 and input into a receiver 88 of the receiving entity. The receiver can include a demodulation block 90, a LDPC decoder 92, and memory 94, 96 for the same puncture sequence and LDPC code used by the transmitter 76. The demodulation block can demodulate vector y, such as in a symbol-by-symbol manner, to thereby produce a hard decision vector t̂ on the received information vector t. The demodulation block can also calculate probabilities of the decision being correct, and then output the hard decision vector and probabilities to the LDPC decoder. The LDPC decoder, then, can iteratively decode the entire received code block and output a decoded information vector ŝ to an information sink 98. In this regard, the decoder can reconstruct the codeword by inserting values that do not bias the decoding of punctured bits (i.e., neutral with respect of decoding a zero or a one) back into the P punctured locations (e.g., zero if log-likelihood-ratio values are used as inputs into the sum-product decoder). The decoder can then decode the reconstructed codeword, such as in a manner attempting to correct any errors due to the channel(s) 44 along with the punctured bits.

A. Irregular Structured LDPC Codes

As shown and explained herein, the LDPC code utilized by the LDPC encoder 78 and the LDPC decoder 92 for performing the respective functions comprises an irregular structured LDPC code. Accordingly, the LDPC code in memory 84, 96 can comprise such an irregular structured LDPC code. Alternatively, the LDPC code can comprise a "seed" LDPC code, or more particularly a "seed" parity-check matrix, from which the LDPC encoder/decoder can construct an irregular structured LDPC code, as explained below. Like the structured LDPC code constructed therefrom, the seed parity-check matrix can comprise an irregular seed parity-check matrix.

Figure 4:
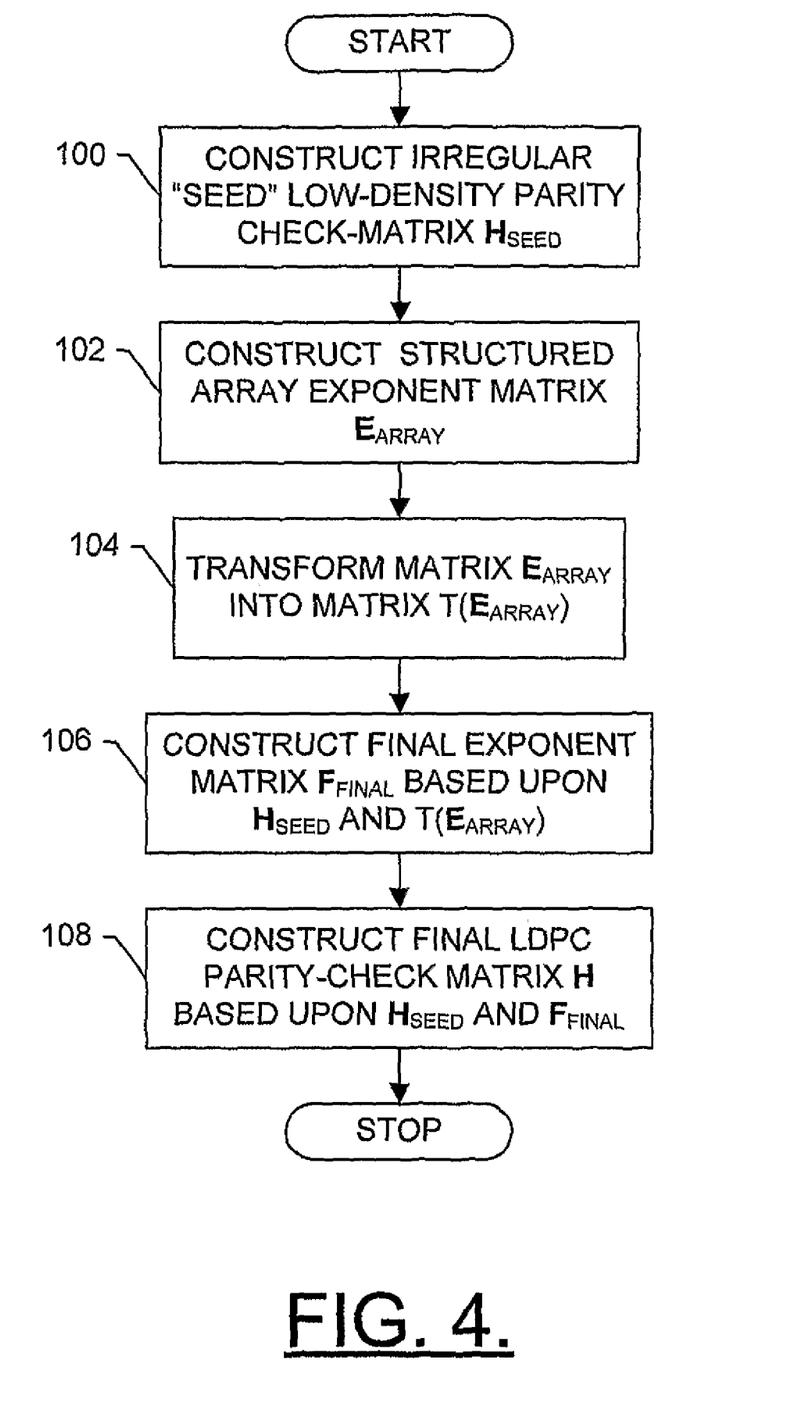
FIG. 4 is a flowchart illustrating various steps in a method of constructing irregular structured LDPC codes according to exemplary embodiments of the present invention.

Referring now to FIG. 4, construction of an irregular structured LDPC code in accordance with exemplary embodiments of the present invention can include constructing an irregular "seed" low-density parity check-matrix $H_{SEED}$, as shown in block 100. The constructed irregular seed low-density parity check-matrix $H_{SEED}$ can comprise a matrix of dimension $((N_{SEED}-K_{SEED})\times N_{SEED})$, where $N_{SEED}$ and $K_{SEED}$ represent the number of elements and information elements, respectively, for a code defined by $H_{SEED}$. Although there are no limits on the maximum values of $K_{SEED}$ and $N_{SEED}$, such values can be selected to be relatively small in comparison to a target message-word and codeword length. Selecting $K_{SEED}$ and $N_{SEED}$ in this manner may allow for more potential integer multiples of $N_{SEED}$ within the target range of codeword lengths, reduced memory requirements, and simplified code descriptions. And as will be appreciated, the irregular seed low-density parity check-matrix $H_{SEED}$ can be constructed in any of a number of different manners, such as by deriving $H_{SEED}$ from an edge distribution defined by $\lambda_{SEED}(x)$ and $\rho_{SEED}(x)$, the edge distribution being selected for good asymptotic performance and good girth properties. In this regard, good asymptotic performance can be characterized by a good threshold value using belief propagation decoding, and good girth can be characterized by having very few if no variable nodes with a girth of four.

One function of the seed matrix $H_{SEED}$ can be to identify the location and type of sub-matrices in an expanded LDPC parity-check matrix H, matrix H being constructed from $H_{SEED}$ and a given set of permutation matrices, as explained below. In this regard, the permutation matrices in $H_{SEED}$ can determine the location of sub-matrices in the expanded matrix H that contain a permutation matrix of dimension $(N_{SPREAD} \times N_{SPREAD})$ from the given set. One selection within the given set of permutation matrices is defined below. For example, the given set of permutation matrices used herein can be finite and consist of the set:

$$\{P_{SPREAD}^{\infty}, P_{SPREAD}^{0}, P_{SPREAD}^{1}, P_{SPREAD}^{2}, \ldots, P_{SPREAD}^{p-1}\}$$

where p represents a positive integer (a prime number in a preferred embodiment of the invention), $P_{SPREAD}^{0}=I$ represents the identity matrix, $P_{SPREAD}^{1}$ represents a full-rank permutation matrix, $P_{SPREAD}^{2}=P_{SPREAD}^{1}P_{SPREAD}^{1}$, $P_{SPREAD}^{3}=P_{SPREAD}^{1}P_{SPREAD}^{1}P_{SPREAD}^{1}$, etc. up to $P_{SPREAD}^{p-1}$. More particularly, for example, $P_{SPREAD}^{1}$ can comprise the following single circular shift permutation matrix for $N_{SPREAD}=5$:

$$P_{SPREAD}^{1} = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

Alternatively, for example, $P_{SPREAD}^{1}$ can comprise the following alternate single circular shift permutation matrix for $N_{SPREAD}=5$:

$$P_{SPREAD}^{1} = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix}$$

In the preceding, $P_{SPREAD}^{\infty}$ represents the all zeros matrix 0 of dimension $(N_{SPREAD} \times N_{SPREAD})$ (i.e., $P_{SPREAD}^{\infty}=0$ where every element is a zero), and the zeros in $H_{SEED}$ indicate the location of the sub-matrix $P_{SPREAD}^{\infty}=0$ in the expanded matrix H. Thus, the expanded LDPC matrix H can be of dimension ($N_{SPREAD}(N_{SEED}-K_{SEED}) \times N_{SPREAD}N_{SEED}$) with sub-matrices comprising permutation matrices of dimension ($N_{SPREAD} \times N_{SPREAD}$) raised to an exponential power from the set of $\{0, 1, \ldots, p-1, \infty\}$. In addition, the expanded LDPC code can have the same edge distribution as $H_{SEED}$ and can therefore achieve a desired asymptotic performance described by $\lambda_{SEED}(x)$ and $\rho_{SEED}(x)$, provided both $H_{SEED}$ and the expanded matrix H have satisfactory girth properties.

Before, after or as the matrix $H_{SEED}$ is constructed, a structured array exponent matrix $E_{ARRAY}$ can be constructed, as shown in block 102. As with the matrix $H_{SEED}$, the structured array exponent matrix can be constructed in any of a numbered of different manners. For example, the structured array exponent matrix can be constructed as follows:

$$E_{ARRAY} = \begin{bmatrix} E_{1,1} & E_{1,2} & \cdots & E_{1,p} \\ E_{2,1} & E_{2,2} & \cdots & E_{2,p} \\ \vdots & \vdots & \ddots & \vdots \\ E_{p,1} & E_{p,2} & \cdots & E_{p,p} \end{bmatrix}$$

where $E_{i,j} \sim (i-1) \bmod p$, although it should be understood that the modulo arithmetic of the value p need not be utilized. The value p can be selected in a number of different manners, but in one exemplary embodiment, p is a prime number. In addition, value p can be at least the column dimension of the matrix $H_{SEED}$ and the column dimension of the spreading permutation matrix. Further, it should be noted that $N_{SEED}$ and $N_{SPREAD}$ can be selected such that $N_{SEED} \leq p$ and $N_{SPREAD} \leq p$, although other values are possible.

After constructing the seed and structured array exponent matrices, $H_{SEED}$ and $E_{ARRAY}$, respectively, a final exponent matrix $F_{FINAL}$ can be constructed based upon those matrices in order to expand the seed matrix into H. Before constructing the final exponent matrix $F_{FINAL}$, however, the structured array exponent matrix $E_{ARRAY}$ can be transformed into matrix $T(E_{ARRAY})$ of dimension (($N_{SEED}-K_{SEED}$)$\times N_{SEED}$) such that the final exponent matrix $F_{FINAL}$ can be constructed from the transformation in lieu of the array exponent matrix, as shown in block 104. For example, the structured array exponent matrix $E_{ARRAY}$ can be transformed by shifting of rows to construct an upper triangular matrix while replacing vacated element locations with $\infty$, such as in the following manner:

$$E_{SHIFT} = \begin{bmatrix} E_{1,1} & E_{1,2} & E_{1,3} & \cdots & E_{1,p} \\ \infty & E_{2,1} & E_{2,1} & \cdots & E_{2,p-1} \\ \infty & \infty & E_{3,1} & \cdots & E_{3,p-2} \\ \vdots & \vdots & \vdots & \ddots & \vdots \\ \infty & \infty & \infty & \cdots & E_{p,1} \end{bmatrix}$$

Alternatively, the structured array exponent matrix $E_{ARRAY}$ can be transformed by truncating one or more columns and/or rows to select a sub-matrix of $E_{ARRAY}$ for implementation with a specified $H_{SEED}$. In yet another alternative, the structured array exponent matrix $E_{ARRAY}$ can be transformed by the combination of both shifting and truncation. For example, given $N_{SEED}+1 \leq p$ and $N_{SPREAD} \leq p$, $E_{ARRAY}$ can be transformed by both shifting and truncation as follows:

$$E_{TRUNCATE1} = \begin{bmatrix} E_{1,2} & E_{1,3} & E_{1,4} & \cdots & E_{1,(N_{SEED}-K_{SEED})} & \cdots & E_{1,(N_{SEED}+1)} \\ E_{2,1} & E_{2,2} & E_{2,3} & \cdots & E_{2,(N_{SEED}-K_{SEED}-1)} & \cdots & E_{2,N_{SEED}} \\ \infty & E_{3,1} & E_{3,2} & \cdots & E_{3,(N_{SEED}-K_{SEED}-2)} & \cdots & E_{3,(N_{SEED}-1)} \\ \vdots & \vdots & \vdots & \ddots & \vdots & \ddots & \vdots \\ \infty & \infty & \infty & \cdots & E_{(N_{SEED}-K_{SEED}),1} & \cdots & E_{(N_{SEED}-K_{SEED}),(K_{SEED}+2)} \end{bmatrix}$$

And for $N_{SEED}+2 \leq p$ and $N_{SPREAD} \leq p$, $E_{ARRAY}$ can be transformed by both shifting and truncation as follows:

$$E_{TRUNCATE2} = \begin{bmatrix} E_{2,2} & E_{2,3} & E_{2,4} & \cdots & E_{2,(N_{SEED}-K_{SEED})} & \cdots & E_{2,(N_{SEED}+1)} \\ E_{3,1} & E_{3,2} & E_{3,3} & \cdots & E_{3,(N_{SEED}-K_{SEED}-1)} & \cdots & E_{3,N_{SEED}} \\ \infty & E_{4,1} & E_{4,2} & \cdots & E_{4,(N_{SEED}-K_{SEED}-2)} & \cdots & E_{4,(N_{SEED}-1)} \\ \vdots & \vdots & \vdots & \ddots & \vdots & \ddots & \vdots \\ \infty & \infty & \infty & \cdots & E_{(N_{SEED}-K_{SEED}+1),1} & \cdots & E_{(N_{SEED}-K_{SEED}+1),(K_{SEED}+2)} \end{bmatrix}$$

As will be appreciated, then, transformation of the structured array exponent matrix $E_{ARRAY}$ can include shifting and/or truncating the matrix in any of a number of different manners, as well as column and row permutation transformations performed either prior to or after other individual transformations in a nested fashion. It should be understood, however, that this family of transformations may include an identity transformation. In one exemplary embodiment of the present invention, then, $T(E_{ARRAY}) = E_{ARRAY}$.

Irrespective of if, and if so how, the structured array exponent matrix $E_{ARRAY}$ is transformed, the final exponent matrix $F_{FINAL}$ can be constructed therefrom, as shown in block 106. In this regard, the final exponent matrix $F_{FINAL}$ can be defined as follows:

$$F_{FINAL} = \begin{bmatrix} F_{1,1} & F_{1,2} & \cdots & F_{1,N_{SEED}} \\ F_{2,1} & F_{2,2} & \cdots & F_{2,N_{SEED}} \\ \vdots & \vdots & \ddots & \vdots \\ F_{(N_{SEED}-K_{SEED}),1} & F_{(N_{SEED}-K_{SEED}),2} & \cdots & F_{(N_{SEED}-K_{SEED}),N_{SEED}} \end{bmatrix}$$

where $F_{FINAL}$ can be of dimension (($N_{SEED}-K_{SEED}$)$\times N_{SEED}$). In this regard, $F_{FINAL}$ can be constructed by replacing each element in $H_{SEED}$ with a corresponding element (i.e. the same row and column) in the transformed structured array exponent matrix $T(E_{ARRAY})$ and by replacing each zero in $H_{SEED}$ with infinity (i.e., ∞). Thus, the elements of $F_{FINAL}$ can belong to the set $\{0, 1, \ldots, p-1, \infty\}$ if modulo arithmetic is used in the construction of $E_{ARRAY}$.

After constructing the final exponent matrix $F_{FINAL}$, a final LDPC parity-check matrix H that describes the LDPC code can be constructed based upon the seed matrix $H_{SEED}$ and $F_{FINAL}$, such as by expanding $H_{SEED}$ using $F_{FINAL}$, as shown in block 108. In this regard, as indicated above, matrix $H_{SEED}$ of dimension $((N_{SEED}-K_{SEED}) \times N_{SEED})$ can be spread or otherwise expanded using the elements of the permutation matrix set:

$$\{P_{SPREAD}^\infty, P_{SPREAD}^0, P_{SPREAD}^1, P_{SPREAD}^2, \ldots, P_{SPREAD}^{p-1}\}$$

with elements of dimension $(N_{SPREAD} \times N_{SPREAD})$, such as into the following parity-check matrix H:

$$H = \begin{bmatrix} P_{SPREAD}^{F_{1,1}} & P_{SPREAD}^{F_{1,2}} & \cdots & P_{SPREAD}^{F_{1,N_{SEED}}} \\ P_{SPREAD}^{F_{2,1}} & P_{SPREAD}^{F_{2,2}} & \cdots & P_{SPREAD}^{F_{2,N_{SEED}}} \\ \vdots & \vdots & \ddots & \vdots \\ P_{SPREAD}^{F_{(N_{SEED}-K_{SEED}),1}} & P_{SPREAD}^{F_{(N_{SEED}-K_{SEED}),2}} & \cdots & P_{SPREAD}^{F_{(N_{SEED}-K_{SEED}),N_{SEED}}} \end{bmatrix}$$

where matrix H is of dimension $(N_{SPREAD}(N_{SEED}-K_{SEED}) \times N_{SPREAD}N_{SEED})$. In this regard, matrix H describes sub-matrices of dimension $(N_{SPREAD} \times N_{SPREAD})$ in the (i,j)th sub-matrix location including the permutation matrix $P_{SPREAD}$ raised to the $F_{i,j}$ power (i.e., $P_{SPREAD}^{F_{i,j}}$), where $F_{i,j}$ is the matrix element in the (i,j)th location of $F_{FINAL}$. For more information on such a method for constructing irregularly structured LDPC codes, see U.S. patent application Ser. No. 11/174,335, entitled: Irregularly Structured, Low Density Parity Check Codes, filed Jul. 1, 2005, the content of which is hereby incorporated by reference.

B. Structured Puncture Sequences

Irrespective of the type and construction of the LDPC code (parity-check matrix H) utilized by the LDPC encoder 78 and the LDPC decoder 92, the puncture sequences utilized by the LDPC encoder and the LDPC decoder for performing the respective functions comprises a structured puncture sequence. In this regard, the puncture sequence in memory 82, 94 can comprise such a structured puncture sequence.

Alternatively, the puncture sequence can comprise a "seed" puncture sequence from which the LDPC encoder/decoder can construct a structured puncture sequence, as explained below. The seed puncture sequence can comprise a puncture-degree sequence including the number of non-zero elements (variable degree) of the columns of the parity-check matrix H to be punctured, or a puncture-node sequence including the non-zero element locations (variable-node locations) of the columns to be punctured. Accordingly exemplary embodiments of the present invention may be explained in terms of the particular puncture sequence, as explained below.

1. Puncture-Degree Sequences

Figure 5A:
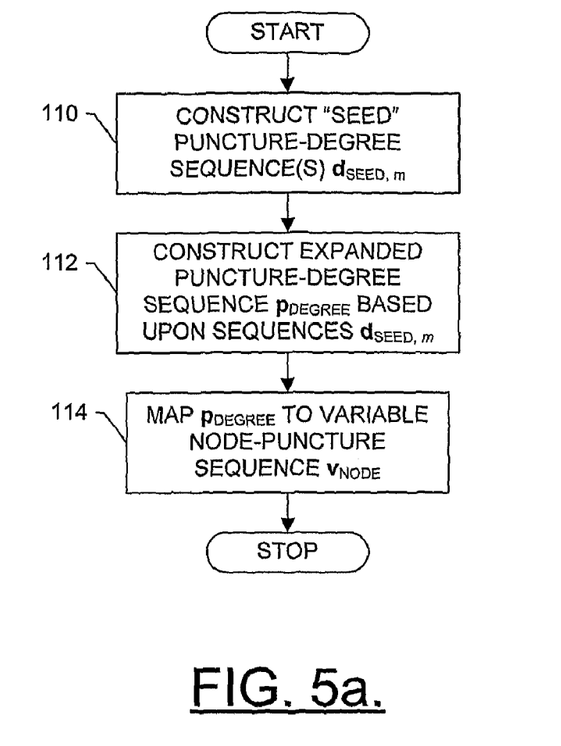
FIGS. 5a and 5b are flowcharts illustrating various steps in a method of constructing a structured puncture sequence in accordance with two exemplary embodiments of the present invention.

Referring FIG. 5a, construction of a structured puncture sequence in accordance with one exemplary embodiment of the present invention can include constructing or otherwise providing one or more "seed" puncture-degree sequences $d_{SEED,m}$ of dimension $(L_m \times 1)$ for $m=1, 2, \ldots M$, as shown in block 110. Written notationally, then, the seed puncture-degree sequences can be defined as follows:

$$d_{SEED,m} = \begin{bmatrix} d_1^{(m)} & d_2^{(m)} & \cdots & d_{L_m}^{(m)} \end{bmatrix}^T$$

where, as used herein, superscript T notationally represents a matrix transpose. The puncture-degree sequences $d_{SEED,m}$ can be constructed in any of a number of different manners. For example, the puncture-degree sequences $d_{SEED,m}$ can be constructed such that each element $d_i^{(m)}$ indicates the degree of a variable node corresponding to a codeword element to be punctured in the code defined by a parity-check matrix $H_m$, where $H_1$ may comprise $H_{SEED}$. In such an instance, the parity-check matrix $H_m$ can comprise a matrix of dimension $(m(N_{SEED}-K_{SEED}) \times mN_{SEED})$ where $m=N_{SPREAD}$. In this regard, although there is no limit on the maximum value of m (i.e., M), it may be desirable to keep memory costs low and hence keep M as a small number.

Irrespective of how the seed puncture-degree sequences $d_{SEED,m}$ are constructed, an expanded puncture-degree sequence $p_{DEGREE}$ of dimension $((L_m N/mN_{SEED}) \times 1)$ can thereafter be constructed based upon the seed puncture-degree sequences $d_{SEED,m}$, as shown in block 112. In this regard, the expanded puncture-degree sequence $p_{DEGREE}$ may contain the variable-degrees corresponding to the columns of the expanded parity-check matrix H of dimension $((N-K) \times N)$ where $N/mN_{SEED}$ can be a positive integer. More particularly, for example, expanded puncture-degree sequence $p_{DEGREE}$ can be constructed as follows:

$$p_{DEGREE}^T = d_{SEED,m}^T \otimes 1_{\left(1 \times \left(\frac{N}{mN_{SEED}}\right)\right)}$$

$$= \begin{bmatrix} d_1^{(m)} & d_2^{(m)} & \cdots & d_{L_m}^{(m)} \end{bmatrix} \otimes \underbrace{\begin{bmatrix} 1 & 1 & \cdots & 1 \end{bmatrix}}_{\left(\frac{N}{mN_{SEED}}\right)}$$

$$= \underbrace{\begin{bmatrix} d_1^{(m)} & d_1^{(m)} & \cdots & d_1^{(m)} & d_2^{(m)} & d_2^{(m)} & \cdots & d_2^{(m)} & \cdots & d_{L_m}^{(m)} & d_{L_m}^{(m)} & \cdots & d_{L_m}^{(m)} \end{bmatrix}}_{\left(\frac{L_m N}{mN_{SEED}}\right)}$$

$$= \begin{bmatrix} p_1 & p_2 & \cdots & p_{\left(\frac{L_m N}{mN_{SEED}}\right)} \end{bmatrix}$$

where each element $p_i$ indicates the degree of a variable node corresponding to a codeword element to be punctured in the expanded code defined by H, and $\otimes$ represents the Kronecker product.

After constructing the expanded puncture-degree sequence $p_{DEGREE}$, the expanded puncture-degree sequence may, but need not, be mapped to a variable node-puncture sequence $v_{NODE}$, as shown in block 114. In such instances, each element of $v_{NODE}$, $v_i$, may have the degree $p_i$ for i=1, 2, ..., $(L_m N/mN_{SEED})$. Written notationally, such a mapping step may be represented as follows:

$$p_{DEGREE}^T \rightarrow v_{NODE}^T = \begin{bmatrix} v_1 & v_2 & \cdots & v_{\left(\frac{L_m N}{mN_{SEED}}\right)} \end{bmatrix}$$

where $v_i \in \{1, 2, \ldots, N\}$ for i=1, 2, ..., $$\left(\frac{L_m N}{mN_{SEED}}\right),$$

and elements from the set $\{1, 2, \ldots, N\}$ occur at most once within the variable-node puncture sequence $v_{NODE}$ (i.e., the same codeword element is typically not punctured more than once). The variable-node puncture sequence $v_{NODE}$ or a contiguous subset thereof, then, can correspond to the structured puncture sequence utilized by the LDPC encoder 78 and the LDPC decoder 92 to process parity-check matrix H.

Generally, the degree-to-node mapping may be summarized as $p_{DEGREE} \rightarrow v_{NODE}$. For example, the very first variable node in H (starting from either left or right) may be used to correspond the degree-sequence in $p_{DEGREE}$ (or a contiguous subset thereof). Alternatively, for example, the variable nodes with the smallest girth may be used to correspond to the degree-sequence in $p_{DEGREE}$ (or a contiguous subset thereof). In another alternative, example, the variable nodes that recover from puncturing in the fewest number of iterations may be used. In yet another alternative, for example, parity elements may be punctured first, followed by systematic elements of the codeword. Irrespective of the specific degree-to-node mapping, however, such an approach allows for flexibility in implementation and designed performance.

2. Puncture-Node Sequences

Figure 5B:
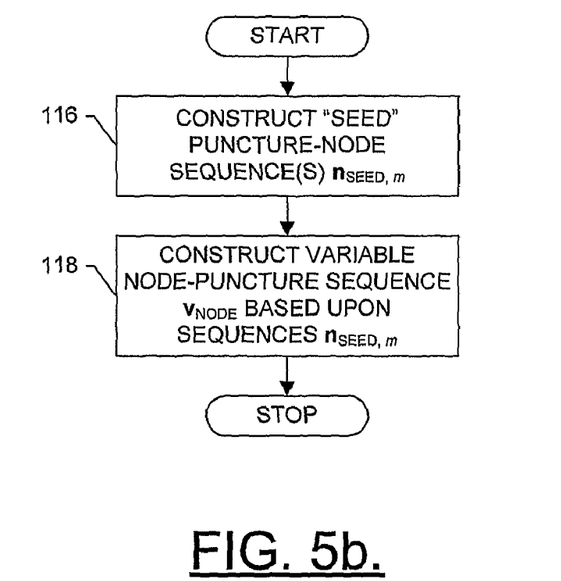

Referring FIG. 5b, construction of a structured puncture sequence in accordance with another exemplary embodiment of the present invention can include constructing or otherwise providing one or more "seed" puncture-node sequences $n_{SEED,m}$ of dimension $(L_m \times 1)$ for m=1, 2, ... M, as shown in block 116. Written notationally, the seed puncture-node sequences can be defined as follows:

$$n_{SEED,m} = \begin{bmatrix} n_1^{(m)} & n_2^{(m)} & \cdots & n_{L_m}^{(m)} \end{bmatrix}^T$$

The puncture-node sequences $n_{SEED,m}$ can be constructed in any of a number of different manners. For example, the puncture-node sequences $n_{SEED,m}$ can be constructed such that the elements $n_i^{(m)} \in \{1, 2, \ldots, mN_{SEED}\}$ for i=1, 2, ..., $L_m$ may correspond to variable nodes in the code defined by a parity-check matrix $H_m$, where $H_1 = H_{SEED}$. As before, although there is no limit on the maximum value of m (i.e., M), it may be desirable to keep memory costs low and hence keep M as a small number. Alternatively, the puncture-node sequences $n_{SEED,m}$ can be constructed by mapping seed puncture-degree sequences $d_{SEED,m}$ to puncture-node sequences $n_{SEED,m}$ (i.e., $d_{SEED,m} \rightarrow n_{SEED,m}$) according to one or more criteria selected by the designer (e.g. smallest girth, fastest convergence, etc.).

Irrespective of how the seed puncture-node sequences $n_{SEED,m}$ are constructed, a variable node-puncture sequence $v_{NODE}$ can thereafter be constructed based upon the seed puncture-node sequences $n_{SEED,m}$, as shown in block 118. In this regard, the variable node-puncture sequence $v_{NODE}$ can be defined as follows:

$$v_{NODE}^T = [v_1^T \, v_2^T \ldots v_{L_m}^T]$$

where $v_{NODE}$ indicates the variable-nodes to be punctured in the expanded matrix H (i.e. codeword elements corresponding to the column locations specified by $v_{NODE}$). The elements $v_1^T$ of $v_{NODE}^T$, then, can be constructed as follows:

$$v_i^T = \begin{bmatrix} 1 & 2 & \cdots & \frac{N}{mN_{SEED}} \end{bmatrix} + (n_i^{(m)} - 1)\frac{N}{mN_{SEED}}$$

for i=1, 2, ..., $L_m$.

Again, the variable-node puncture sequence $v_{NODE}$ or a contiguous subset thereof, then, can correspond to the structured puncture sequence utilized by the LDPC encoder 78 and the LDPC decoder 92 to process parity-check matrix H.

As explained above, the LDPC encoder 78 and the LDPC decoder 92 can utilize a contiguous subset the variable-node puncture sequence $v_{NODE}$ to puncture parity-check matrix H. In such instances, the encoder/decoder can utilize a contiguous subset of $v_{NODE}$ (or $p_{DEGREE}$) of cardinality P (including P=0) to construct LDPC codes of effective code rates:

$$R_{EFF} = \frac{K}{N - P}$$

via puncturing P variable nodes, where $P \in \{0, 1, 2, \ldots, L_m N/mN_{SEED}\}$ for m=1, 2, ..., M. For the sake of utility, P may be constrained P<N−K, although such a constraint is not required. More particularly, for example, the first P elements of $v_{NODE}$ (or $p_{DEGREE}$) may be used to construct punctured LDPC codes of all possible $R_{EFF}$ from matrix E, thereby forming encapsulating contiguous subsets variable-nodes (or variable-degrees). Such a configuration may be suitable for error control systems employing adaptive coding schemes (e.g., hybrid-ARQ) for error correction. In such an instance, seed puncture-degree sequences $d_{SEED,m}$ can be constructed using an approach such as that outlined in the '943 application. Then, such an approach may use the structured techniques explained above to construct $p_{DEGREE}$ and $v_{NODE}$, and then use $v_{NODE}$ to puncture code words specified by H. Another similar approach could simply randomly search for $d_{SEED,m}$ or $n_{SEED,m}$, then use the structured techniques explained above to construct $p_{DEGREE}$ and $v_{NODE}$, and finally use $v_{NODE}$ to puncture code words specified by H.

It should also be noted that exemplary embodiments of the present invention described above for structured puncturing may also apply for irregular LDPC codes H that have a single integer multiple of variable nodes matching in both degree and count of a smaller LDPC code (e.g., $H_{SEED}$). Further, as indicated above, it should be noted that exemplary embodiments of the present invention may be equally applicable to puncturing codes other than irregular structured LDPC codes, such as unstructured or otherwise randomly constructed LDPC codes.

According to one exemplary aspect of the present invention, the functions performed by one or more of the entities of the system, such as the terminal 32, BS 34 and/or BSC 36 including respective transmitting and receiving entities 70, 72, may be performed by various means, such as hardware and/or firmware, including those described above, alone and/or under control of one or more computer program products. The computer program product(s) for performing one or more functions of exemplary embodiments of the present invention includes at least one computer-readable storage medium, such as the non-volatile storage medium, and software including computer-readable program code portions, such as a series of computer instructions, embodied in the computer-readable storage medium.

In this regard, FIGS. 4, 5a and 5b are flowcharts of methods, systems and program products according to exemplary embodiments of the present invention. It will be understood that each block or step of the flowcharts, and combinations of blocks in the flowcharts, can be implemented by various means, such as hardware, firmware, and/or software including one or more computer program instructions. These computer program instructions may be loaded onto a computer or other programmable apparatus to produce a machine, such that the instructions which execute on the computer or other programmable apparatus create means for implementing the functions specified in the flowcharts block(s) or step(s). As will be appreciated, any such computer program instructions may also be stored in a computer-readable memory that can direct a computer or other programmable apparatus (i.e., hardware) to function in a particular manner, such that the instructions stored in the computer-readable memory produce an article of manufacture including instruction means which implement the function specified in the flowcharts block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowcharts block(s) or step(s).

Accordingly, blocks or steps of the flowcharts support combinations of means for performing the specified functions, combinations of steps for performing the specified functions and program instruction means for performing the specified functions. It will also be understood that one or more blocks or steps of the flowcharts, and combinations of blocks or steps in the flowcharts, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus comprising a processor and a memory storing executable instructions that in response to execution by the processor cause the apparatus to at least perform the following:

providing a seed puncture sequence, the seed puncture sequence including a plurality of elements based upon non-zero elements of a plurality of columns of a parity-check matrix having a column dimension and a row dimension, the parity-check matrix defining an error correction code and having been constructed based upon a seed parity-check matrix derived from an edge distribution ensemble; and constructing a variable node-puncture sequence based upon the seed puncture sequence, the variable node-puncture sequence corresponding to a puncture sequence configured for processing an error correction code.

2. An apparatus according to claim 1, wherein providing a seed puncture sequence comprises providing a seed puncture-degree sequence, the seed puncture-degree sequence including a plurality of elements that each indicate a number of non-zero elements of a column of the parity-check matrix.

3. An apparatus according to claim 2, wherein providing a seed puncture-degree sequence comprises providing at least one seed puncture-degree sequence $d_{SEED,m}$ of dimension $(L_m \times 1)$ for m=1, 2, ... M, the seed puncture-degree sequence $d_{SEED,m}$ including a plurality of elements that each indicate a number of non-zero elements of the column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

4. An apparatus according to claim 3, wherein constructing a variable node-puncture sequence comprises:

constructing an expanded puncture-degree sequence $p_{DEGREE}$ of dimension $((L_m N/mN_{SEED}) \times 1)$ based upon the at least one seed puncture-degree sequence $d_{SEED,m}$, the expanded puncture-degree sequence including a plurality of elements that each indicate a number of non-zero elements of the column of an expanded parity-check matrix H of dimension $((N-K) \times N)$, $N/mN_{SEED}$ comprising a positive integer; and mapping the expanded puncture-degree sequence to a variable node-puncture sequence, the variable node-puncture sequence including a plurality of elements that each indicate a location of a column of the expanded parity-check matrix H.

5. An apparatus according to claim 1, wherein providing a seed puncture sequence comprises providing a seed puncture-node sequence, the seed puncture-node sequence including a plurality of elements that each indicate a location of a column of the parity-check matrix.

6. An apparatus according to claim 5, wherein providing a seed puncture-node sequence comprises providing at least one seed puncture-node sequence $n_{SEED,m}$ of dimension $(L_m \times 1)$ for m=1, 2, . . . M, the seed puncture-node sequence $n_{SEED,m}$ including a plurality of elements that each indicate a location of a column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

7. An apparatus according to claim 6, wherein constructing a variable node-puncture sequence comprises constructing a variable node-puncture sequence $v_{NODE}^T = [v_1^T \ v_2^T \ \ldots \ v_{L_m}^T]$ based upon at least one seed puncture-node sequence $$n_{SEED,m} = \begin{bmatrix} n_1^{(m)} & n_2^{(m)} & \cdots & n_{L_m}^{(m)} \end{bmatrix}^T,$$

the variable node-puncture sequence $v_{NODE}{}^T$ including a plurality of elements:

$$v_i^T = \begin{bmatrix} 1 & 2 & \cdots & \dfrac{N}{mN_{SEED}} \end{bmatrix} + (n_i^{(m)} - 1)\dfrac{N}{mN_{SEED}}$$

for i=1, 2, ..., $L_m$, superscript T notationally representing a matrix transpose, and N representing a length of an expanded parity-check matrix H.

8. An apparatus according to claim 1, wherein the execution of the executable instructions by the processor further causes the apparatus to perform processing an error correction code based upon the puncture sequence, the error correction code having been generated by:
   providing the seed parity-check matrix, the seed parity check matrix having a column dimension and a row dimension;
   constructing a structured array exponent matrix using modulo arithmetic of a number equal to or greater than the seed parity-check matrix column dimension;
   constructing a final exponential matrix based upon the seed parity-check matrix and the structured array exponent matrix; and
   expanding the final exponential matrix to form an expanded parity-check matrix corresponding to the error correction code.

9. An apparatus comprising:
   a first means for providing a seed puncture sequence, the seed puncture sequence including a plurality of elements based upon non-zero elements of a plurality of columns of a parity-check matrix having a column dimension and a row dimension, the parity-check matrix defining an error correction code and having been constructed based upon a seed parity-check matrix derived from an edge distribution ensemble; and
   a second means for constructing a variable node-puncture sequence based upon the seed puncture sequence, the variable node-puncture sequence corresponding to a puncture sequence configured for processing an error correction code.

10. An apparatus according to claim 9, wherein the first means is for providing a seed puncture-degree sequence, the seed puncture-degree sequence including a plurality of elements that each indicate a number of non-zero elements of a column of the parity-check matrix.

11. An apparatus according to claim 10, wherein the first means is for providing at least one seed puncture-degree sequence $d_{SEED,m}$ of dimension $(L_m \times 1)$ for m=1, 2, ... M, the seed puncture-degree sequence $d_{SEED,m}$ including a plurality of elements that each indicate a number of non-zero elements of the column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

12. An apparatus according to claim 11, wherein the second means is for constructing a variable node-puncture sequence by:
   constructing an expanded puncture-degree sequence $p_{DEGREE}$ of dimension $((L_m N/mN_{SEED}) \times 1)$ based upon the at least one seed puncture-degree sequence $d_{SEED,m}$, the expanded puncture-degree sequence including a plurality of elements that each indicate a number of non-zero elements of the column of an expanded parity-check matrix H of dimension $((N-K) \times N)$, $N/mN_{SEED}$ comprising a positive integer; and
   mapping the expanded puncture-degree sequence to a variable node-puncture sequence, the variable node-puncture sequence including a plurality of elements that each indicate a location of a column of the expanded parity-check matrix H.

13. An apparatus according to claim 9, wherein the first means is for providing a seed puncture-node sequence, the seed puncture-node sequence including a plurality of elements that each indicate a location of a column of the parity-check matrix.

14. An apparatus according to claim 13, wherein the first means is for providing at least one seed puncture-node sequence $n_{SEED,m}$ of dimension $(L_m \times 1)$ for m=1, 2, ... M, the seed puncture-node sequence $n_{SEED,m}$ including a plurality of elements that each indicate a location of a column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

15. An apparatus according to claim 14, wherein the second means is for constructing a variable node-puncture sequence $v_{NODE}{}^T = [v_1^T \, v_2^T \, \ldots \, v_{L_m}^T]$ based upon at least one seed puncture-node sequence $$n_{SEED,m} = \begin{bmatrix} n_1^{(m)} & n_2^{(m)} & \cdots & n_{L_m}^{(m)} \end{bmatrix}^T,$$

the variable node-puncture sequence $v_{NODE}{}^T$ including a plurality of elements:

$$v_i^T = \begin{bmatrix} 1 & 2 & \cdots & \dfrac{N}{mN_{SEED}} \end{bmatrix} + (n_i^{(m)} - 1)\dfrac{N}{mN_{SEED}}$$

for i=1, 2, ..., $L_m$, superscript T notationally representing a matrix transpose, and N representing a length of an expanded parity-check matrix H.

16. An apparatus according to claim 9 further comprising:
   a third means for processing an error correction code based upon the puncture sequence, the error correction code having been generated by:
   providing the seed parity-check matrix, the seed parity check matrix having a column dimension and a row dimension;
   constructing a structured array exponent matrix using modulo arithmetic of a number equal to or greater than the seed parity-check matrix column dimension;
   constructing a final exponential matrix based upon the seed parity-check matrix and the structured array exponent matrix; and
   expanding the final exponential matrix to form an expanded parity-check matrix corresponding to the error correction code.

17. A method comprising:
   providing a seed puncture sequence, the seed puncture sequence including a plurality of elements based upon non-zero elements of a plurality of columns of a parity-check matrix having a column dimension and a row dimension, the parity-check matrix defining an error correction code and having been constructed based upon a seed parity-check matrix derived from an edge distribution ensemble; and constructing a variable node-puncture sequence based upon the seed puncture sequence, the variable node-puncture sequence corresponding to a puncture sequence configured for processing an error correction code, wherein providing a seed puncture sequence and constructing a variable node-puncture sequence are performed by a processor configured to provide the seed puncture sequence and construct the variable node-puncture sequence.

18. A method according to claim 17, wherein providing a seed puncture sequence comprises providing a seed puncture-degree sequence, the seed puncture-degree sequence including a plurality of elements that each indicate a number of non-zero elements of a column of the parity-check matrix.

19. A method according to claim 18, wherein providing a seed puncture-degree sequence comprises providing at least one seed puncture-degree sequence $d_{SEED,m}$ of dimension $(L_m \times 1)$ for $m=1, 2, \ldots M$, the seed puncture-degree sequence $d_{SEED,m}$ including a plurality of elements that each indicate a number of non-zero elements of the column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

20. A method according to claim 19, wherein constructing a variable node-puncture sequence comprises:

constructing an expanded puncture-degree sequence $p_{DEGREE}$ of dimension $((L_m N/mN_{SEED}) \times 1)$ based upon the at least one seed puncture-degree sequence $d_{SEED,m}$, the expanded puncture-degree sequence including a plurality of elements that each indicate a number of non-zero elements of the column of an expanded parity-check matrix H of dimension $((N-K) \times N)$, $N/mN_{SEED}$ comprising a positive integer; and mapping the expanded puncture-degree sequence to a variable node-puncture sequence, the variable node-puncture sequence including a plurality of elements that each indicate a location of a column of the expanded parity-check matrix H.

21. A method according to claim 17, wherein providing a seed puncture sequence comprises providing a seed puncture-node sequence, the seed puncture-node sequence including a plurality of elements that each indicate a location of a column of the parity-check matrix.

22. A method according to claim 21, wherein providing a seed puncture-node sequence comprises providing at least one seed puncture-node sequence $n_{SEED,m}$ of dimension $(L_m \times 1)$ for $m=1, 2, \ldots M$, the seed puncture-node sequence $n_{SEED,m}$ including a plurality of elements that each indicate a location of a column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

23. A method according to claim 22, wherein constructing a variable node-puncture sequence comprises constructing a variable node-puncture sequence $v_{NODE}^T = [v_1^T \ v_2^T \ldots v_{L_m}^T]$ based upon at least one seed puncture-node sequence $$n_{SEED,m} = \left[ n_1^{(m)} \ n_2^{(m)} \ \cdots \ n_{L_m}^{(m)} \right]^T,$$

the variable node-puncture sequence $v_{NODE}^T$ including a plurality of elements:

$$v_i^T = \left[ 1 \ 2 \ \cdots \ \frac{N}{mN_{SEED}} \right] + (n_i^{(m)} - 1) \frac{N}{mN_{SEED}}$$

for $i=1, 2, \ldots, L_m$, superscript T notationally representing a matrix transpose, and N representing a length of an expanded parity-check matrix H.

24. A method according to claim 17 further comprising:

processing an error correction code based upon the puncture sequence, the error correction code having been generated by:

providing the seed parity-check matrix, the seed parity check matrix having a column dimension and a row dimension;

constructing a structured array exponent matrix using modulo arithmetic of a number equal to or greater than the seed parity-check matrix column dimension;

constructing a final exponential matrix based upon the seed parity-check matrix and the structured array exponent matrix; and expanding the final exponential matrix to form an expanded parity-check matrix corresponding to the error correction code.

25. A computer program product comprising at least one computer-readable storage medium having computer-readable program code portions stored therein that in response to execution by a processor cause an apparatus to at least perform the following:

providing a seed puncture sequence, the seed puncture sequence including a plurality of elements based upon non-zero elements of a plurality of columns of a parity-check matrix having a column dimension and a row dimension, the parity-check matrix defining an error correction code and having been constructed based upon a seed parity-check matrix derived from an edge distribution ensemble; and constructing a variable node-puncture sequence based upon the seed puncture sequence, the variable node-puncture sequence corresponding to a puncture sequence configured for processing an error correction code.

26. A computer program product according to claim 25, wherein providing a seed puncture sequence comprises providing a seed puncture-degree sequence, the seed puncture-degree sequence including a plurality of elements that each indicate a number of non-zero elements of a column of the parity-check matrix.

27. A computer program product according to claim 26, wherein providing a seed puncture-degree sequence comprises providing at least one seed puncture-degree sequence $d_{SEED,m}$ of dimension $(L_m \times 1)$ for $m=1, 2, \ldots M$, the seed puncture-degree sequence $d_{SEED,m}$ including a plurality of elements that each indicate a number of non-zero elements of the column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

28. A computer program product according to claim 27, wherein constructing a variable node-puncture sequence comprises:
constructing an expanded puncture-degree sequence $p_{DEGREE}$ of dimension $((L_m N/mN_{SEED}) \times 1)$ based upon the at least one seed puncture-degree sequence $d_{SEED,m}$, the expanded puncture-degree sequence including a plurality of elements that each indicate a number of non-zero elements of the column of an expanded parity-check matrix H of dimension $((N-K) \times N)$, $N/mN_{SEED}$ comprising a positive integer; and
mapping the expanded puncture-degree sequence to a variable node-puncture sequence, the variable node-puncture sequence including a plurality of elements that each indicate a location of a column of the expanded parity-check matrix H.

29. A computer program product according to claim 25, wherein providing a seed puncture sequence comprises providing a seed puncture-node sequence, the seed puncture-node sequence including a plurality of elements that each indicate a location of a column of the parity-check matrix.

30. A computer program product according to claim 29, wherein providing a seed puncture-node sequence comprises providing at least one seed puncture-node sequence $n_{SEED,m}$ of dimension $(L_m \times 1)$ for $m=1, 2, \ldots M$, the seed puncture-node sequence $n_{SEED,m}$ including a plurality of elements that each indicate a location of a column of parity-check matrix $H_m$ of dimension $(m(N_{SEED}-K_{SEED}) \times mN_{SEED})$, $N_{SEED}$ and $K_{SEED}$ representing a length and a number of information bits, respectively, of the error correction code defined by the seed parity-check matrix.

31. A computer program product according to claim 30, wherein constructing a variable node-puncture sequence comprises constructing a variable node-puncture sequence $v_{NODE}^T = [v_1^T \ v_2^T \ \ldots \ v_{L_m}^T]$ based upon at least one seed puncture-node sequence $$n_{SEED,m} = [n_1^{(m)} \ n_2^{(m)} \ \cdots \ n_{L_m}^{(m)}]^T,$$

the variable node-puncture sequence $v_{NODE}^T$ including a plurality of elements:

$$v_i^T = \begin{bmatrix} 1 & 2 & \cdots & \frac{N}{mN_{SEED}} \end{bmatrix} + (n_i^{(m)} - 1) \frac{N}{mN_{SEED}}$$

for $i=1, 2, \ldots, L_m$, superscript T notationally representing a matrix transpose, and N representing a length of an expanded parity-check matrix H.

32. A computer program product according to claim 25, wherein, the execution of the computer-readable program code portions by the processor further causes the apparatus to perform:
processing an error correction code based upon the puncture sequence, the error correction code having been generated by:
providing the seed parity-check matrix, the seed parity check matrix having a column dimension and a row dimension;
constructing a structured array exponent matrix using modulo arithmetic of a number equal to or greater than the seed parity-check matrix column dimension;
constructing a final exponential matrix based upon the seed parity-check matrix and the structured array exponent matrix; and
expanding the final exponential matrix to form an expanded parity-check matrix corresponding to the error correction code.

* * * * *